(12) United States Patent
Chang et al.

(10) Patent No.: US 12,394,831 B2
(45) Date of Patent: Aug. 19, 2025

(54) POWER SUPPLY DEVICE

(71) Applicant: SANYO Electric Co., Ltd., Kadoma (JP)

(72) Inventors: Jeewook Chang, Kanagawa (JP); Takahiro Kamikawa, Osaka (JP)

(73) Assignee: PANASONIC ENERGY CO., LTD., Osaka (JP)

( * ) Notice: Subject to any disclaimer, the term of this patent is extended or adjusted under 35 U.S.C. 154(b) by 221 days.

(21) Appl. No.: 17/913,777

(22) PCT Filed: Mar. 24, 2021

(86) PCT No.: PCT/JP2021/012185
§ 371 (c)(1),
(2) Date: Sep. 22, 2022

(87) PCT Pub. No.: WO2021/200446
PCT Pub. Date: Oct. 7, 2021

(65) Prior Publication Data
US 2024/0213559 A1    Jun. 27, 2024

(30) Foreign Application Priority Data
Mar. 30, 2020 (JP) .................................. 2020-061462

(51) Int. Cl.
*H01M 10/48* (2006.01)
*G01R 27/18* (2006.01)
(Continued)

(52) U.S. Cl.
CPC .......... *H01M 10/482* (2013.01); *G01R 27/18* (2013.01); *H02H 3/023* (2013.01); *H02J 13/00012* (2020.01); *H01M 2010/4278* (2013.01)

(58) Field of Classification Search
None
See application file for complete search history.

(56) References Cited

U.S. PATENT DOCUMENTS

| | | | |
|---|---|---|---|
| 2012/0200266 A1* | 8/2012 | Berkowitz | ............ H01M 10/44 320/139 |
| 2018/0294666 A1* | 10/2018 | Tian | .................. H02M 3/33523 |

FOREIGN PATENT DOCUMENTS

| | | |
|---|---|---|
| JP | 2002-325370 A | 11/2002 |
| JP | 2006-292516 A | 10/2006 |
| JP | 2014-087129 A | 5/2014 |

OTHER PUBLICATIONS

International Search Report dated Jun. 1, 2021, issued in counterpart application No. PCT/JP2021/012185.

* cited by examiner

*Primary Examiner* — Kevin M Bernatz
(74) *Attorney, Agent, or Firm* — WHDA, LLP

(57) ABSTRACT

A failure of battery modules is reliably determined. A power supply device includes: battery modules (2) each of which included a failure determination unit (21) configured to determine a failure and a normality and to output the failure and the normality as a High signal and a low signal; a failure transmission line (3) connected to the failure determination unit (21) of each battery module (2); and a module failure determination circuit (1) connected to the failure transmission line (3) and configured to determine failure and normality of the battery modules (2). The module failure determination circuit (1) includes: a voltage determination circuit (4) configured to determine a High level and a Low level of the failure transmission line (3); an impedance detection circuit (5) configured to detect an impedance with respect to a ground line (23); and a calculation circuit (6) configured to determine the failure and the normality of the plurality of battery modules (2) and an abnormality of the failure transmission line (3) based on outputs of the voltage determination circuit (4) and the impedance detection circuit (5).

6 Claims, 1 Drawing Sheet

(51) Int. Cl.
    *H01M 10/42*     (2006.01)
    *H02H 3/02*     (2006.01)
    *H02J 13/00*     (2006.01)

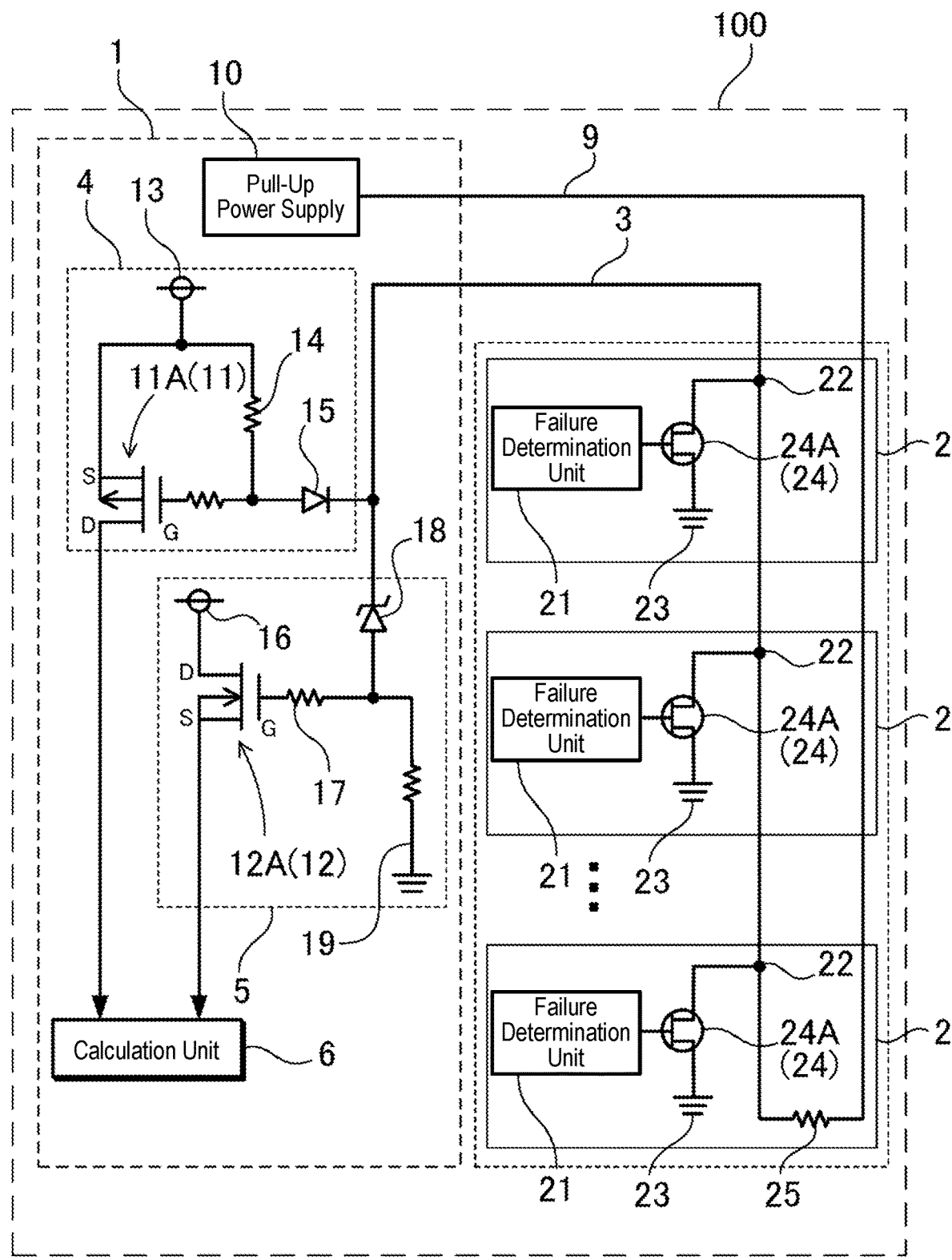

POWER SUPPLY DEVICE

TECHNICAL FIELD

The present invention relates to a power supply device including battery modules, and more particularly, to a power supply device in which a failure and a normality of each battery module are transmitted to a module failure determination circuit on a failure transmission line.

BACKGROUND ART

A power supply device including battery modules is used as a power supply device of an electric vehicle, a power storage device, or the like since the number of the battery modules is increased to increase a charge and discharge capacity and obtain large output. The power supply device detects a failure of each battery module to ensure a stable operation (see PTL 1).

In the power supply device described above, each battery module includes a failure determination unit for self-diagnosis to determine a failure and a normality of the battery modules. States of all the battery modules can be monitored by connecting the failure determination unit to a failure transmission line and connecting the battery modules to a module failure determination circuit that determines the failure and the normality of all the battery modules.

CITATION LIST

Patent Literature

PTL 1: Japanese Patent Laid-Open Publication No. 2014-087129

SUMMARY OF THE INVENTION

Problem to be Solved by the Invention

The power supply device can determine the failure of each battery module by the module failure determination circuit. This power supply device can detect that any of the battery modules is in failure by the module failure determination circuit by connecting the failure determination unit provided in each battery module to the failure transmission line. In this power supply device, the failure determination unit of each battery module connected to the failure transmission line outputs a High signal in a normal state and a Low signal in a failure state. The module failure determination circuit determines that all the battery modules are normal while the failure transmission line is at a High level, and determines that any of the battery modules is in failure while the failure transmission line is at a Low level. The power supply device configured to determine the failure and the normality according to the High and Low levels of the failure transmission line cannot accurately determine the failure and the normality of the battery modules by detecting the High and Low levels while the failure transmission line is not normal, for example, in a state such as a contact failure or disconnection of the failure transmission line. Therefore, the power supply device configured to determine the failure of the battery modules only according to the High and Low levels may not accurately determine the failure and the normality of the battery modules.

The invention is developed for a purpose of further eliminating the above drawbacks, and one of objects of the invention is to provide a power supply device capable of reliably determining a failure of battery modules.

Solution to Problem

A power supply device according to one embodiment of the invention includes: plural battery modules each of which includes a failure determination unit configured to determine a failure and a normality and to output the failure and the normality as a High signal and a low signal; a failure transmission line connected to the failure determination unit of each battery module; and a module failure determination circuit connected to the failure transmission line, the module failure determination circuit being configured to determine failure and normality of the battery modules. The module failure determination circuit includes: a voltage determination circuit configured to determine a High level and a Low level of the failure transmission line; an impedance detection circuit configured to detect an impedance with respect to a ground line; and a calculation circuit configured to determine the failure and the normality of the battery modules and an abnormality of the failure transmission line based on outputs of the voltage determination circuit and the impedance detection circuit.

Advantage of the Invention

The power supply device reliably detects the failure of the battery modules.

BRIEF DESCRIPTION OF DRAWINGS

FIG. 1 is a block diagram of a power supply device according to an exemplary embodiment of the invention.

DESCRIPTION OF EMBODIMENTS

Hereinafter, the invention will be described in detail with reference to the drawings. In the following description, terms (for example, "upper", "lower", and other terms including these terms) indicating specific directions and positions are used, as necessary. The use of these terms is intended to facilitate understanding of the invention with reference to the drawings, and the technical scope of the invention is not limited by meanings of these terms. Parts of the same reference numerals appearing in a plurality of drawings indicate the same or equivalent parts or members.

Further, the embodiments described below are specific examples of the technical idea of the invention, and the invention is not limited to the following embodiments. In addition, the dimensions, materials, shapes, relative arrangements, or the like of components described below are not intended to limit the scope of the invention to the following description, but are intended to be exemplified unless otherwise specified. Contents described in one embodiment and examples can also be applied to other embodiments and examples. A size, a positional relationship, and the like of the members shown in the drawings may be exaggerated in order to clarify the description.

A power supply device according to a first aspect of the invention includes: battery modules, each battery module including a failure determination unit configured to determine a failure and a normality and to output the failure and the normality as a High signal and a low signal; a failure transmission line connected to the failure determination unit of each battery module; and a module failure determination circuit connected to the failure transmission line, the module failure determination circuit being configured to determine failure and normality of the battery modules. The module failure determination circuit includes: a voltage determination circuit configured to determine a High level and a Low level of the failure transmission line; an impedance detection circuit configured to detect an impedance with respect to a ground line; and a calculation circuit configured to determine the failure and the normality of the battery modules and an abnormality of the failure transmission line based on outputs of the voltage determination circuit and the impedance detection circuit.

The power supply device described above reliably detects the failure of the battery modules. In particular, the failure and the normality of the battery modules and the abnormality of the failure transmission line can be reliably detected. A reason is that in the power supply device described above, the calculation circuit determines the failure and the normality of the battery modules and the abnormality of the failure transmission line based on outputs of the voltage determination circuit configured to determine High and Low levels of the failure transmission line and the impedance detection circuit configured to detect the impedance with respect to the ground line.

A power supply device according to a second aspect of the invention includes a pull-up power supply connected to a terminal end of the failure transmission line via a series resistor. The pull-up power supply is configured to pull up a voltage of the failure transmission line to a High level. The failure determination unit includes a short-circuit switch configured to connect the failure transmission line to the ground line in response to either a failure or a normal so as to cause the failure transmission line to be at a Low level.

In a power supply device according to a third aspect of the invention, the failure determination unit is configured to turn on the short-circuit switch upon determining a failure of the each of the plurality of the battery modules so as to cause the failure transmission line to be at a Low level.

In a power supply device according to a fourth aspect of the invention, the voltage determination circuit includes a first switching element configured to: be turned on upon detecting the Low level of the fault transmission line; and be turned off upon detecting the High level of the failure transmission line and a high impedance higher than a predetermined impedance. The impedance detection circuit includes a second switching element configured to: be turned on upon detecting the High level the failure transmission line; and be turned off upon detecting the Low level of the failure transmission line and the high impedance higher than the predetermined impedance. The calculation circuit is configured to: determine that the plurality of battery modules are normal in response to turning off of the first switching element and turning on of the second switching element; determine that the plurality of battery modules is abnormal in response to turning on of the first switching element and turning off of the second switching element; and determine that the failure transmission line is abnormal in response to turning off of both the first switching element and the second switching element.

In the power supply device described above, since the calculation circuit determines the failure and the normality of the battery modules and the abnormality of the failure transmission line in response to the turning on and off of the first switching element of the voltage determination circuit and the second switching element of the impedance detection circuit, the failure of the battery module or the abnormality of the failure transmission line can be easily and reliably detected.

In a power supply device according to a fifth aspect of the invention, the first switching element comprises a p-channel FET. The FET includes a drain as an output, a source connected to a power supply, and a gate connected to the power supply via an input resistor and connected to the failure transmission line via a diode. The diode is connected such that a direction of a current flowing from a gate to the failure transmission line is a forward direction of the diode.

In a power supply device according to a sixth aspect of the invention, the second switching element comprises an n-channel FET. The FET includes a source as an output and a gate connected to the ground line via an input resistor and connected to the failure transmission line via a Zener diode. The Zener diode is connected such that a direction of a current flowing from the gate to the failure transmission line is a forward direction of the Zener diode. A Zener voltage of the Zener diode is determined such that a voltage obtained by subtracting the Zener voltage from a voltage of the High level of the failure transmission line is input to the gate and turns on the FET.

Exemplary Embodiment 1

Power supply device 100 shown in FIG. 1 includes battery modules 2, failure transmission line 3 connected to battery modules 2, and module failure determination circuit 1 configured to determine failure and normality of battery modules 2 based on High and Low level of failure transmission line 3 and to further determine the abnormality of failure transmission line 3 based on the impedance of failure transmission line 3.

Battery Module 2

Battery module 2 includes rechargeable battery cells (not shown) therein, and further includes a circuit board (not shown). A protection circuit or the like that detects a voltage, a remaining capacity or the like of the battery cells is mounted onto the circuit board. Battery module 2 includes failure determination unit 21 configured to determine whether battery module 2 is normal or in failure. For example, failure determination unit 21 detects the failure of the battery cells and the circuit board, and cause connection terminal 22 of failure transmission line 3 to be a High level or a Low level. Failure determination unit 21 includes short-circuit switch 24 connected between connection terminal 22 and ground line 23. Short-circuit switch 24 may be implemented by a semiconductor switching element, such as an FET or a transistor. Failure determination unit 21 shown in FIG. 1 turn on short-circuit switch 24 as FET 24A by inputting an ON voltage to the gate of the FET upon determining the failure. Failure determination unit 21 turns off switches FET 24A by setting a gate voltage of FET 24A to an OFF voltage in the normal state.

Failure Transmission Line 3

A terminal end of failure transmission line 3 is connected to a positive side of pull-up power supply 10 via pull-up resistor 25 to cause connection terminal 22 of failure transmission line 3 to be at a High level while short-circuit switch 24 is turned off. In power supply device 100 shown in FIG. 1, pull-up power supply 10 is provided in module failure determination circuit 1, and is connected to the terminal end of failure transmission line 3 via power supply line 9 and pull-up resistor 25. While power supply device 100 does not specify a voltage of pull-up power supply 10, the voltage is set to, for example, 12V.

Since FET 24A of short-circuit switch 24 of failure determination unit 21 of battery module 2 is turned off in the normal state, connection terminal 22 is at a High level when battery module 2 is in the normal state. Since FET 24A of short-circuit switch 24 is switched to be turned on in the failure state of battery module 2, FET 24A of short-circuit switch 24 connects connection terminal 22 to ground line 23 to be set to a Low level while failure determination unit 21 determines that the failure occurs.

Connection terminal 22 of failure determination unit 21 of each of battery modules 2 is connected to failure transmission line 3. Therefore, when failure determination unit 21 of any of battery modules 2 detects a failure and switches short-circuit switch 24 to turn on short-circuit switch 24, failure transmission line 3 is connected to ground line 23 to be set to the Low level via short-circuit switch 24 which is turned on. While all battery modules 2 operate normally, short-circuit switches 24 of all battery modules 2 are continuously turned off, and failure transmission line 3 is held at the High level.

Module Failure Determination Circuit 1

Module failure determination circuit 1 includes voltage determination circuit 4 configured to determine High and Low levels of failure transmission line 3, impedance detection circuit 5 configured to detect the impedance of failure transmission line 3 with respect to ground line 23, and calculation circuit 6 configured to determine the failure and the normality of battery modules 2 and the abnormality of failure transmission line 3 based on outputs of voltage determination circuit 4 and impedance detection circuit 5.

Voltage Determination Circuit 4

Voltage determination circuit 4 is configured to detect the voltage of failure transmission line 3 and determine the failure and the normality of each battery module 2. Voltage determination circuit 4 includes first switching element 11 which is turned on upon detecting the Low level of failure transmission line 3 and is turned off upon detecting the High level of failure transmission line 3. First switching element 11 is p-channel FET 11A. FET 11A includes a drain as an output side connected to calculation circuit 6, a source connected to power supply 13, a gate connected to power supply 13 via input resistor 14 and connected to failure transmission line 3 via diode 15. Diode 15 is connected such that a direction of a current flowing from the gate to failure transmission line 3 is a forward direction of the diode.

In voltage determination circuit 4 described above, the current does not flow through diode 15 while the voltage of failure transmission line 3 is at a High level, and the gate of p-channel FET 11A is connected to the source to turned off. When failure transmission line 3 is at the Low level, failure transmission line 3 is energized from power supply 13 via input resistor 14 and diode 15 in the forward direction of the diode, an ON voltage which is negative with respect to power supply 13 is input to the gate of FET 11A, and turns on FET 11A. In addition, since failure transmission line 3 has the high impedance in an abnormal state, failure transmission line 3 having the high impedance cannot be energized in the forward direction from power supply 13 to diode 15, the gate of FET 11A is at a High level, and FET 11A is turned off. Voltage determination circuit 4 turns on FET 11A of first switching element 11 only while the battery module 2 is in failure, that is, in the state in which any of battery modules 2 is in failure, and outputs a High signal from the drain of the FET to calculation circuit 6. When all battery modules 2 are in the normal state or failure transmission line 3 is in the abnormal state, FET 11A of first switching element 11 is turned off, and the High signal is not output.

Impedance Detection Circuit 5

Impedance detection circuit 5 includes second switching element 12. Second switching element 12 is turned on upon detecting the High level of failure transmission line 3, and is switched to be turned off upon detecting the Low level of failure transmission line 3 and the high impedance. Second switching element 12 that performs the above operations is n-channel FET 12A. FET 12A includes a drain connected to power supply 16 as an input side, a source connected to calculation circuit 6 as an output side, and a gate connected to ground line 19 via input resistor 17 and connected to failure transmission line 3 via Zener diode 18. Zener diode 18 is connected such that a direction of a current flowing from the gate to failure transmission line 3 is a forward direction of the Zener diode. Zener diode 18 is configured to turn off FET 12A in response to the Low level of failure transmission line 3. The Zener voltage of Zener diode 18 is determined such that a voltage obtained by subtracting the Zener voltage from the High level voltage of failure transmission line 3 is input to the gate of FET 12A and turns on FET 12A. The Zener voltage of Zener diode 18 is higher than the voltage received from power supply 13 of voltage determination circuit 4 via diode 15 in the forward direction while failure transmission line 3 has a high impedance.

In impedance detection circuit 5 described above, while failure transmission line 3 is at the High level, the on voltage is input to the gate of FET 12A via Zener diode 18 and turns on FET 12A. While failure transmission line 3 is at the Low level, the gate is connected to ground line 23 via Zener diode 18 and input resistor 17, the gate voltage of FET 12A is a cutoff voltage, and FET 12A is turned off. When failure transmission line 3 has the high impedance due to disconnection or a contact failure of failure transmission line 3, the gate of FET 12A is not connected to ground line 23 by failure transmission line 3 but is connected to ground line 23 via input resistor 17, so that the gate voltage is the cutoff voltage and FET 12A is switched to be turned off. FET 12A which is second switching element 12 outputs the High level from the source to calculation circuit 6 while being turned on, and does not output the High level while being turned off in which the source is not connected to the drain.

Calculation Circuit 6

Calculation circuit 6 determines the failure of battery modules 2 and the abnormality of failure transmission line 3 by detecting turning on and off of first switching element 11 of voltage determination circuit 4 and second switching element 12 of impedance detection circuit 5, that is, the High signals output from voltage determination circuit 4 and impedance detection circuit 5. Calculation circuit 6 determines the failures of battery modules 2 and failure transmission line 3 as follows.

1. The calculation circuit determines that all battery modules 2 are normal while first switching element 11 of voltage determination circuit 4 is turned off and impedance detection circuit 5 has second switching element 12 turned on and outputs a High level.

2. The calculation circuit determines that any one of battery modules 2 is abnormal while voltage determination circuit 4 has first switching element 11 turned on and outputs a High level and second switching element 12 of impedance detection circuit 5 is turned off.

3. The calculation circuit determine that failure transmission line 3 is abnormal while first switching element 11 of voltage determination circuit 4 and second switching element 12 of impedance detection circuit 5 are turned off and none of voltage determination circuit 4 and impedance detection circuit 5 output a High level.

INDUSTRIAL APPLICABILITY

The invention can be effectively used in applications of a large-output power supply device including a plurality of battery modules.

REFERENCE MARKS IN THE DRAWINGS 100 power supply device
1 module failure determination circuit
2 battery module
3 failure transmission line
4 voltage determination circuit
5 impedance detection circuit
6 calculation circuit
9 power supply line
10 pull-up power supply
11 first switching element
11A FET
12 second switching element
12A FET
13 power supply
14 input resistor
15 diode
16 power supply
17 input resistor
18 Zener diode
19 ground line
21 failure determination unit
22 connection terminal
23 ground line
24 short-circuit switch
24A FET
25 pull-up resistor

The invention claimed is:

1. A power supply device comprising:
a plurality of battery modules, each of the plurality of battery modules including a failure determination unit configured to determine a failure and a normality and to output the failure and the normality as a High signal and a low signal;
a failure transmission line connected to the failure determination unit of each of the plurality of battery modules; and
a module failure determination circuit connected to the failure transmission line, the module failure determination circuit being configured to determine failure and normality of the plurality of battery modules, wherein
the module failure determination circuit includes:
a voltage determination circuit configured to determine a High level and a Low level of the failure transmission line;
an impedance detection circuit configured to detect an impedance with respect to a ground line; and
a calculation circuit configured to determine the failure and the normality of the plurality of battery modules and an abnormality of the failure transmission line based on outputs of the voltage determination circuit and the impedance detection circuit.

2. The power supply device of claim 1, further comprising a pull-up power supply connected to a terminal end of the failure transmission line via a series resistor, the pull-up power supply being configured to pull up a voltage of the failure transmission line to a High level, wherein the failure determination unit includes a short-circuit switch configured to connect the failure transmission line to the ground line in response to either a failure or a normal so as to cause the failure transmission line to be at a Low level.

3. The power supply device of claim 2, wherein the failure determination unit is configured to turn on the short-circuit switch upon determining a failure of the each of the plurality of the battery modules so as to cause the failure transmission line to be at a Low level.

4. The power supply device of claim 3, wherein
the voltage determination circuit includes a first switching element configured to:
be turned on upon detecting the Low level of the failure transmission line; and
be turned off upon detecting the High level of the failure transmission line and a high impedance higher than a predetermined impedance,
the impedance detection circuit includes a second switching element configured to:
be turned on upon detecting the High level the failure transmission line; and
be turned off upon detecting the Low level of the failure transmission line and the high impedance higher than the predetermined impedance, and
the calculation circuit is configured to:
determine that the plurality of battery modules are normal in response to turning off of the first switching element and turning on of the second switching element;
determine that the plurality of battery modules is abnormal in response to turning on of the first switching element and turning off of the second switching element; and
determine that the failure transmission line is abnormal in response to turning off of both the first switching element and the second switching element.

5. The power supply device of claim 4, wherein
the first switching element comprises a p-channel FET,
the FET includes:
a drain as an output;
a source connected to a power supply; and
a gate connected to the power supply via an input resistor and connected to the failure transmission line via a diode, and
the diode is connected such that a direction of a current flowing from a gate to the failure transmission line is a forward direction of the diode.

6. The power supply device of claim 4, wherein
the second switching element comprises an n-channel FET,
the FET includes:
a source as an output; and
a gate connected to the ground line via an input resistor and connected to the failure transmission line via a Zener diode,
the Zener diode is connected such that a direction of a current flowing from the gate to the failure transmission line is a forward direction of the Zener diode, and
a Zener voltage of the Zener diode is determined such that a voltage obtained by subtracting the Zener voltage from a voltage of the High level of the failure transmission line is input to the gate and turns on the FET.

* * * * *